(12) United States Patent
Itoyama et al.

(10) Patent No.: US 10,964,579 B2
(45) Date of Patent: Mar. 30, 2021

(54) ELECTROSTATIC CHUCK

(71) Applicant: TOTO LTD., Kitakyushu (JP)

(72) Inventors: Tetsuro Itoyama, Kitakyushu (JP); Jumpei Uefuji, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 16/810,220

(22) Filed: Mar. 5, 2020

(65) Prior Publication Data

US 2020/0286766 A1 Sep. 10, 2020

(30) Foreign Application Priority Data

Mar. 5, 2019 (JP) .............................. JP2019-039826

(51) Int. Cl.
*H01T 23/00* (2006.01)
*H01L 21/683* (2006.01)

(52) U.S. Cl.
CPC .................................. *H01L 21/6833* (2013.01)

(58) Field of Classification Search
None
See application file for complete search history.

(56) References Cited

U.S. PATENT DOCUMENTS

2010/0122774 A1* 5/2010 Makabe ............ H01L 21/67109
156/345.52
2013/0286532 A1 10/2013 Kataigi et al.
2016/0276198 A1 9/2016 Anada et al.
2017/0358476 A1* 12/2017 Horiuchi ........... H01L 21/67017
2019/0035667 A1* 1/2019 Minemura ............ C04B 35/111

FOREIGN PATENT DOCUMENTS

| JP | 2005-268654 A | 9/2005 |
| JP | 2010-034404 A | 2/2010 |
| JP | 2010-123712 A | 6/2010 |
| JP | 2013-232640 A | 11/2013 |
| JP | 2014-209615 A | 11/2014 |
| JP | 2017-157726 A | 9/2017 |

* cited by examiner

*Primary Examiner* — Stephen W Jackson
(74) *Attorney, Agent, or Firm* — Carrier Blackman & Associates, P.C.; William D. Blackman; Joseph P. Carrier (57) ABSTRACT

According to the embodiment, an electrostatic chuck includes a ceramic dielectric substrate, a base plate, and a porous part. The ceramic dielectric substrate has a first major surface placing a suction object, a second major surface on an opposite side to the first major surface, and a through hole provided from the second to first major surface. The base plate supports the ceramic dielectric substrate and includes a gas introduction path communicating with the through hole. The porous part is provided in the gas introduction path. The porous part includes sparse portions including pores and a dense portion having a higher density than the sparse portions. Each of the sparse portions extends in a first direction from the base plate toward the ceramic dielectric substrate. The dense portion is positioned between the sparse portions. The sparse portions include the pores and a wall portion provided between the pores.

7 Claims, 10 Drawing Sheets

ELECTROSTATIC CHUCK

CROSS-REFERENCE TO RELATED APPLICATIONS

This application is based upon and claims the benefit of priority from Japanese Patent Application No. 2019-039826, filed on Mar. 5, 2019; the entire contents of which are incorporated herein by reference.

FIELD

Embodiments described herein relate generally to an electrostatic chuck.

BACKGROUND

An electrostatic chuck made of ceramic manufactured by sandwiching electrodes between ceramic electrostatic substrates made of alumina and firing them applies an electrostatic suction power to built-in electrodes and sucks a substrate such as a silicon wafer or the like by an electrostatic force. In the electrostatic chuck like this, an inactive gas such as helium (He) or the like is flown between a surface of the ceramic dielectric substrate and a back side of the substrate being a suction object, and a temperature of the substrate being the suction object is controlled.

For example, temperature increase of the substrate may be accompanied during processing in a CVD (Chemical Vapor Deposition) apparatus, a sputtering apparatus, an ion implantation apparatus, an etching apparatus or the like in which the substrate is processed. In the electrostatic chuck used for those apparatus, an inactive gas such as He or the like is flown between the ceramic dielectric substrate and the substrate being the suction object, and the temperature increase of the substrate is suppressed by bringing the inactive gas into contact with the substrate.

In the electrostatic chuck which controls the substrate temperature by the inactive gas such as He or the like, holes (gas introduction path) for introducing the inactive gas such as He or the like are provided in the ceramic dielectric substrate and a base plate supporting the ceramic dielectric substrate.

Here, when processing the substrate in the apparatus, discharge may occur in the gas introduction path. JP 2010-123712 A (Kokai) discloses an electrostatic chuck with improved insulating property in the gas introduction path by providing a ceramic sintered porous body in the gas introduction path and using the structure of the ceramic sintered porous body and a film hole as a gas flow path.

However, since the porosity of the porous part is high, the heat transfer rate from the porous part to the ceramic dielectric substrate is lower than the thermal conductivity from the metal base plate to the ceramic dielectric substrate. Therefore, the temperature difference between the substrate temperature when the substrate is cooled by flowing the conductive gas from the gas introduction path and the substrate temperature when not flowing the conductive gas is likely to be large. That is, in the entire substrate, a region having a large temperature difference within the wafer surface (so-called hot spot or cold spot) is generated in a portion close to the porous part, and there is a problem that temperature control with high temperature uniformity of the wafer cannot be performed.

SUMMARY

According to the embodiment, an electrostatic chuck includes a ceramic dielectric substrate, a base plate, and a porous part. The ceramic dielectric substrate has a first major surface placing a suction object, a second major surface on an opposite side to the first major surface, and a through hole provided from the second major surface to the first major surface. The base plate supports the ceramic dielectric substrate. The base plate includes a gas introduction path communicating with the through hole. The base plate is made of a metal. The porous part is provided in the gas introduction path. The porous part includes a plurality of sparse portions and a dense portion. The sparse portions include a plurality of pores. The dense portion has a density higher than a density of the sparse portions. Each of the plurality of sparse portions extends in a first direction from the base plate toward the ceramic dielectric substrate. The dense portion is positioned between the plurality of sparse portions. The sparse portions include the pores and a wall portion. The wall portion is provided between the pores. A minimum value of a dimension of the wall portion is smaller than a minimum value of a dimension of the dense portion in a second direction substantially perpendicular to the first direction.

DETAILED DESCRIPTION

The first invention relates to an electrostatic chuck. The electrostatic chuck includes a ceramic dielectric substrate having a first major surface placing a suction object, a second major surface on an opposite side to the first major surface, and a through hole provided from the second major surface to the first major surface, a metal base plate supporting the ceramic dielectric substrate and including a gas introduction path communicating with the trough hole, and a porous part provided in the gas introduction path. The porous part includes a plurality of sparse portions including a plurality of pores and a dense portion having a density higher than a density of the sparse portions. Each of the sparse portions extends in a first direction from the base plate toward the ceramic dielectric substrate. The dense portion is positioned between the plurality of sparse portions. The sparse portions include the pores and a wall portion provided between the pores, and a minimum value of a dimension of the wall portion is smaller than a minimum value of a dimension of the dense portion in a second direction substantially perpendicular to the first direction.

According to the electrostatic chuck, since the thermal conductivity of the porous part can be increased, temperature control can be made to the suction object with high temperature uniformity of the wafer.

The second invention relates to the electrostatic chuck in the first invention, wherein a dimension of the plurality of pores provided in each of the plurality of sparse portions is smaller than the dimension of the dense portion in the second direction.

According to the electrostatic chuck, since the dimension of the plurality of pores can be sufficiently small, the thermal conductivity of the porous part can be increased and temperature control can be made to the suction object with higher temperature uniformity of the wafer.

The third invention related to the electrostatic chuck in the first or second inventions, wherein an aspect ratio of the plurality of pores provided in each of the plurality of sparse portions is not less than 30.

According to the electrostatic chuck, the temperature uniformity of the wafer can be further improved.

The fourth invention relates to the electrostatic chuck in the one of the first to third inventions, wherein a dimension of the plurality of pores provided in each of the plurality of sparse portions is not less than 1 micrometer and not more than 20 micrometers in the second direction.

According to the electrostatic chuck, since the pores having the pore dimension of 1 to 20 micrometers and extending in one direction can be arranged, the high temperature uniformity of the wafer can be realized.

The fifth invention relates to the electrostatic chuck in one of the first to fourth inventions, wherein when viewed along the first direction, the plurality of pores include a first pore positioned at a center portion of the sparse portion, and a number of pores of the plurality of pores adjacent to the first pore and surrounding the first pore is 6.

According to the electrostatic chuck, in a plan view, it is possible to dispose the plurality of pores with high isotropy and high density. Thereby, while securing the high temperature uniformity of the wafer and the flow rate of the flowing gas, the rigidity of the porous part can be improved.

The sixth invention relates to the electrostatic chuck in one of the first to fifth inventions, further comprising: a bonding layer provided in a part between the base plate and the ceramic dielectric substrate and including a resin material, the bonding layer including a first portion positioned between an end surface of the porous part on the second major surface side and the second major surface in the first direction.

According to the electrostatic chuck, the bonding layer includes the first portion positioned between the end surface of the porous part on the second major surface side and the second major surface in the first direction, and thus even if a pressure along the first direction is applied to the porous part by a gas introduced in the gas introduction path, the porous part can be suppressed from moving along the first direction. Thereby, position shift of the porous part can be suppressed.

The seventh invention relates to the electrostatic chuck in one of the first to sixth inventions, further comprising: a bonding layer provided in a part between the base plate and the ceramic dielectric substrate and including a resin material, the bonding layer including a second portion positioned between the base plate and the porous part in the second direction, the second portion contacting the porous part in the first direction.

According to the electrostatic chuck, the bonding layer includes the second portion positioned between the base plate and the porous part in the second direction and the second portion contacts the porous part in the first direction, and thus the porous part can be surely suppressed from moving in the first direction.

Thereby, position shift of the porous part can be surely suppressed.

Various embodiments will be described hereinafter with reference to the accompanying drawings.

In the drawings, the same reference numbers are applied to the same elements and the detailed description will be omitted as appropriate.

Figure 1:
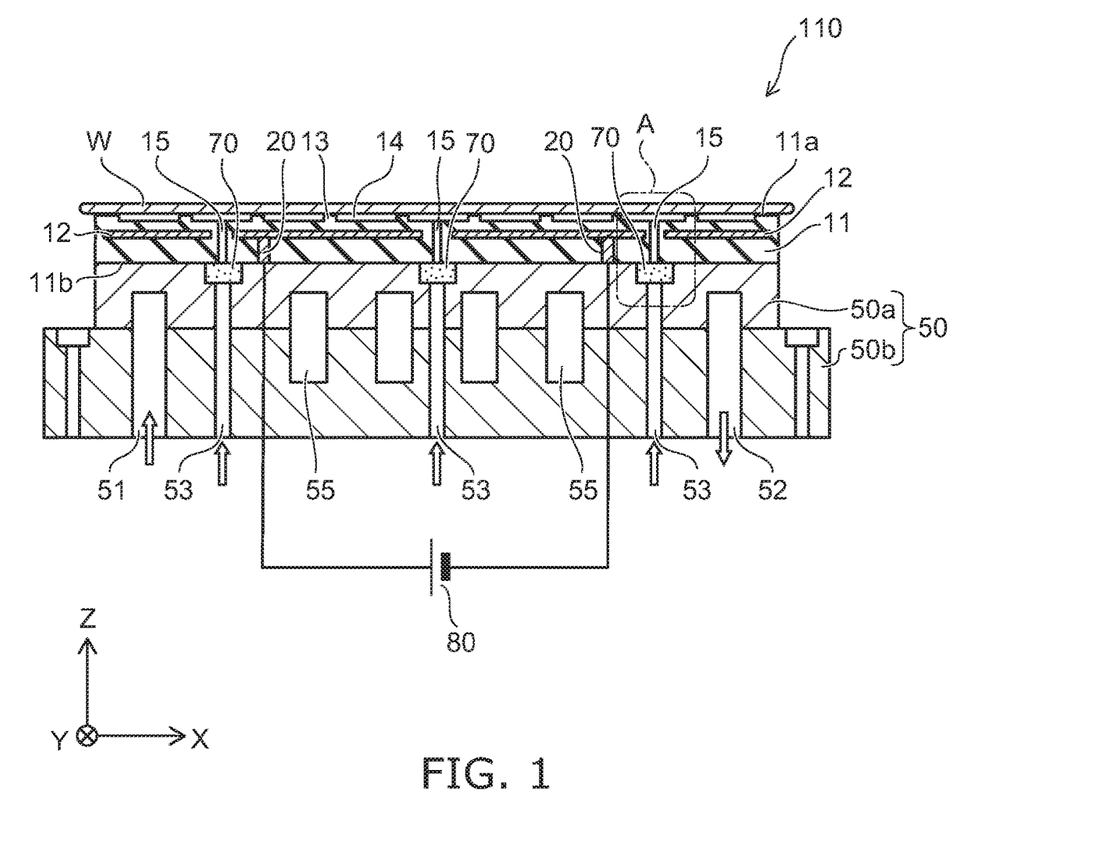
FIG. 1 is a schematic cross sectional view illustrating an electrostatic chuck according to an embodiment.

FIG. 1 is a schematic cross sectional view illustrating an electrostatic chuck according to the embodiment.

As illustrated in FIG. 1, an electrostatic chuck 110 according to the embodiment includes a ceramic dielectric substrate 11, a base plate 50 and a porous part 70.

The ceramic dielectric substrate 11 is, for example, a plate-shaped base material of sintered ceramic, and has a first major surface 11a having a suction object W placed and a second major surface 11b on an opposite side to the first major surface 11a. The suction object W is, for example, a semiconductor substrate or the like such as a silicon wafer or the like.

An electrode 12 is provided on the ceramic dielectric substrate 11. The electrode 12 is provided between the first major surface 11a and the second major surface 11b of the ceramic dielectric substrate 11. That is, the electrode 12 is formed to be inserted into the ceramic dielectric substrate 11. The electrostatic chuck 110 generates a charge on the first major surface 11a side of the electrode 12 by application of a suction holding voltage 80 to the electrode 12, and sucks and holds the object W by an electrostatic force.

Here, in the description of the embodiment, a direction from the base plate 50 toward the ceramic dielectric substrate 11 is taken as a Z-direction (corresponding to one example of a first direction), one of directions substantially perpendicular to the Z-direction is taken as a Y-direction (corresponding to one example of a second direction), and a direction substantially perpendicular to the Z-direction and the Y-direction is taken as an X-direction (corresponding to one example of a second direction).

The electrode 12 is provided to be film-shaped along the first major surface 11a and the second major surface 11b of the ceramic dielectric substrate 11. The electrode 12 is a suction electrode for sucking and holding the object W. The electrode 12 may be either unipolar type or bipolar type. The electrode shown in FIG. 1 is bipolar type, and 2 pole electrodes 12 are provided on the same plane.

The electrode 12 is provided with a connection part 20 extending to the second major surface 11b side of the ceramic dielectric substrate 11. The connection part 20 is a via (solid type) and a via hole (hollow type) communicating with the electrode 12, or a metal terminal is connected by an adequate method such as brazing.

The base plate 50 is a metal member supporting the ceramic dielectric substrate 11. The ceramic dielectric substrate 11 is fixed onto the base plate 50 by the bonding layer 60 illustrated in FIG. 2A.

Figure 2A:
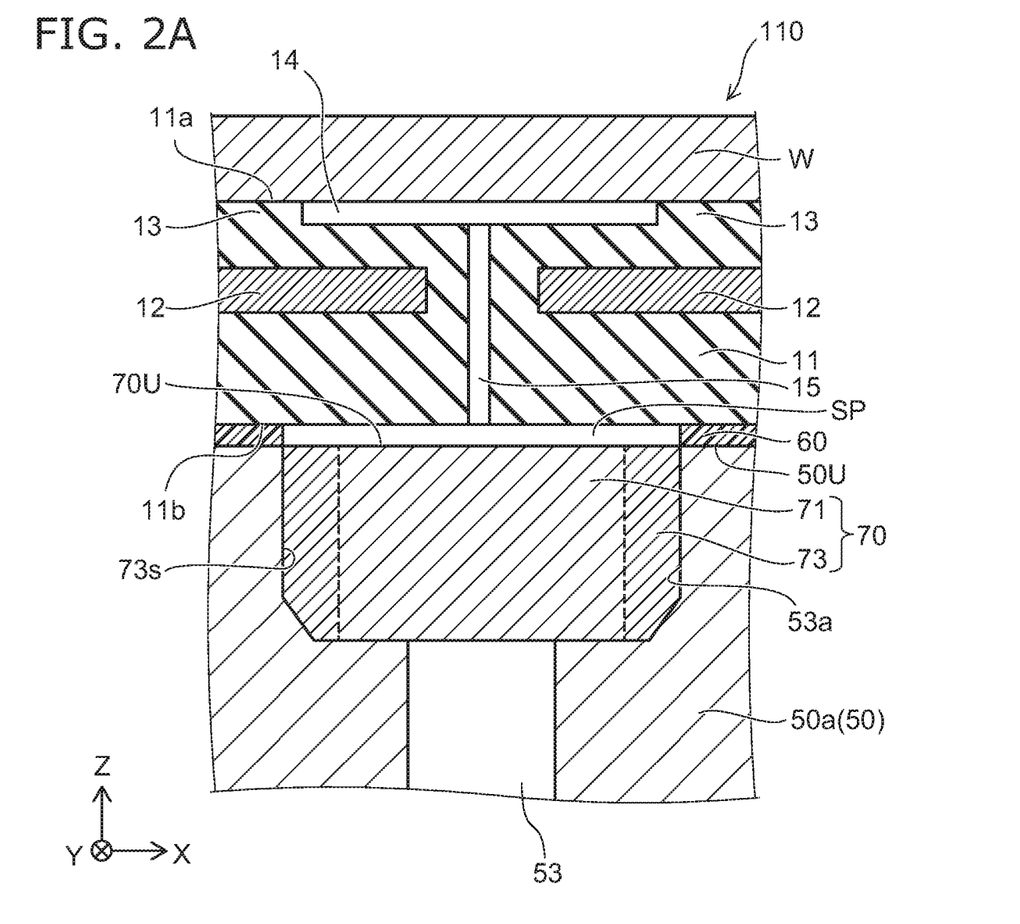
FIG. 2A and FIG. 2B are schematic views illustrating the electrostatic chuck according to the embodiment.

The bonding layer 60 is provided in a part between the base plater 50 and the ceramic dielectric substrate 11 in the Z-direction, and bonds the base plate 50 and the ceramic dielectric substrate 11. The bonding layer 60 includes a resin material. The bonding layer 60 is based on, for example, a hardened layer of silicone adhesive.

The base plater 50 is, for example, divided into an upper portion 50a and a lower portion 50b made of aluminum, and a communicating passage 55 is provided between the upper portion 50a and the lower portion 50b. One end side of the communicating passage 55 is connected to an input path 51, and the other end side of the communicating passage 55 is connected to an output path 52.

The base plate 50 also plays a role to adjust a temperature of the electrostatic chuck 110. For example, when cooling the electrostatic chuck 110, a cooling medium is flown in from the input path 51, is passed through the communicating passage 55, and is flown out from the output path 52. Thereby, a heat of the base plate 50 is absorbed by the cooling medium, and the ceramic dielectric substrate 11 installed thereon can be cooled. On the other hand, when holding the electrostatic chuck 110 warm, it is also possible to put a heat holding medium in the communicating passage 55. It is also possible to incorporate a heating element in the ceramic dielectric substrate 11 and the base plate 50. In this way, when the temperature of the ceramic dielectric substrate 11 is adjusted via the base plater 50, the temperature of the object W to be sucked and held by the electrostatic chuck 110 can be adjusted.

Dots 13 are provided on the first major surface 11a side of the ceramic dielectric substrate 11 as necessary, and a groove 14 is provided between the dots 13. The groove 14 is communicated, and a space is formed between the groove 14 and the back side of the object W placed on the electrostatic chuck 110.

A through hole 15 provided on the ceramic dielectric substrate 11 is connected to the groove 14. The through hole 15 is provided from the second major surface 11b toward the first major surface 11a of the ceramic dielectric substrate 11 to pierce the ceramic dielectric substrate 11.

The temperature of the object W and the particles adhering to the object W can be controlled in a favorable state by adequately selecting a height of the dot 13 (a depth of the groove 14), an area ratio and shapes or the like of the dot 13 and the groove 14.

A gas introduction path 53 is provided in the base plate 50. The gas introduction path 53 is provided, for example, to pierce the base plate 50. The gas introduction path 53 may be provided to reach the ceramic dielectric substrate 11 side by diverging at the middle of the other gas introduction path 53 without piercing the base plate 50. The gas introduction path 53 may be provided at multiple positions of the base plate 50.

The gas introduction path 53 is communicated with the through hole 15. When a transmission gas of helium (He) or the like is introduced from the gas introduction path 53 in a state which the object W is sucked and held, the transmission gas flows in the space provided between the object W and the groove 14, and the object W can be cooled directly by the transmission gas.

The porous part 70 is provided in the gas introduction path 53 provided in the base plate 50. The porous part 70 is fitted in the base plate 50 (gas introduction path 53) on the ceramic dielectric substrate 11 side.

Figure 2B:
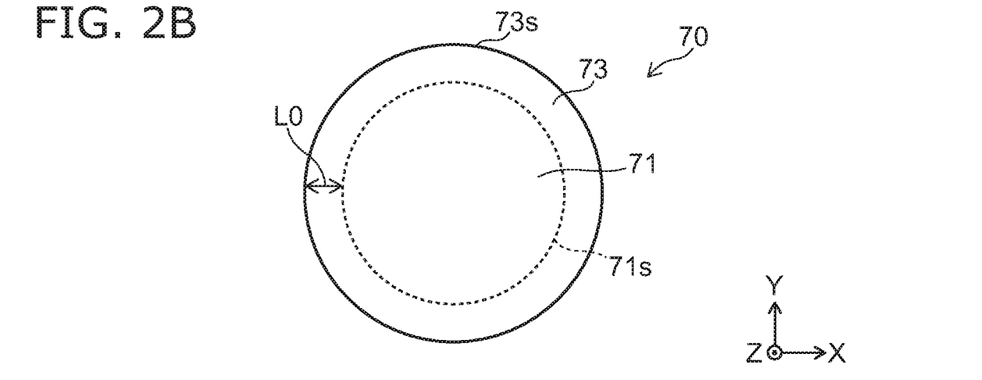

FIG. 2A and FIG. 2B are schematic views illustrating the electrostatic chuck according to the embodiment. FIG. 2A illustrates around the porous part 70. FIG. 2A corresponds to an enlarged view of the portion A shown in FIG. 1. FIG. 2B is a plan view illustrating the porous part 70.

As illustrated in FIG. 2A, for example, a counter sunk portion 53a is provided in the base plate 50 (gas introduction path 53) on the ceramic dielectric substrate 11 side. The counter sunk portion 53a is provided to be tube-shaped. The porous part 70 is fitted in the counter sunk portion 53a by adequately designing an inner diameter of the counter sunk portion 53a.

An upper surface 70U of the porous part 70 is exposed to an upper surface 50U of the base plate 50. The upper surface 70U of the porous part 70 is an end surface of the porous part 70 in the Z-direction (first direction). The upper surface 70U of the porous part 70 opposes the second major surface 11b of the ceramic dielectric substrate 11. There is a space SP between the upper surface 70U of the porous part 70 and the second major surface 11b of the ceramic dielectric substrate 11. That is, the bonding layer 60 is not provided between the upper surface 70U of the porous part 70 and the second major surface 11b of the ceramic dielectric substrate 11.

As illustrated in FIG. 2B, the porous part 70 includes a porous region 71 including multiple pores and a dense region 73 denser than the porous part 71. The dense region 73 is a region having fewer pores than the porous region 71 or a region having substantially no pore. A porosity (percent: %) of the dense region 73 is lower than a porosity (%) of the porous region 71. For that reason, a density (gram/cubic centimeter: g/cm$^3$) of the dense region 73 is higher than the density (g/cm$^3$) of the porous region 71. The dense region 73 is dense compared with the porous region 71, and thus, for example, the rigidity (mechanical strength) of the dense region 73 is higher than the rigidity of the porous region 71.

The porosity of the dense region 73 is, for example, a ratio of a volume of the space (pore) included in the dense region 73 to a total volume of the dense region 73. The porosity of the porous region 71 is, for example, a ratio of a volume (pore) included in the porous region 71 to a total volume of the porous region 71. For example, the porosity of the porous region 71 is not less than 5% and not more than 40%, favorably not less than 10% and not more than 30%, and the porosity of the dense region 73 is not less than 0% and not more than 5%.

The porous part 70 is columnar (for example, cylindrical). The porous region 71 is columnar (for example, cylindrical). The dense region 73 contacts the porous region 71, or is continuous to the porous region 71. As shown in FIG. 2B, when viewed along the Z-direction, the dense region 73 surrounds an outer circumference of the porous region 71. The dense region 73 surrounds a side surface 71s of the porous region 91 and is tubular (for example cylindrical). In other words, the porous region 71 is provided to pierce the dense region 73 in the Z-direction. The gas flown from the gas introduction path 53 passes through multiple pores provided in the porous region 71 and is supplied to the groove 14 through the through hole 15.

The porous part 70 including the porous region 71 like this is provided, and thus while securing the flow rate of the gas flowing through the through hole 15, the thermal conductivity in the porous part 70 can be improved. Therefore, the temperature control with high temperature uniformity of the wafer can be made to the suction object W. The porous part 70 includes the dense region 73, and thus the rigidity (mechanical strength) of the porous part 70 can be improved.

A thickness of the dense region 73 (a length L0 between the side surface 71s of the porous region 71 and the side surface 73s of the dense region 73) is, for example, not less than 100 μm and not more than 1000 μm.

An insulative ceramic is used for a material of the porous part 70. The porous part 70 (each of the porous region 71 and the dense region 73) includes at least one of aluminum oxide ($Al_2O_3$), titanium oxide ($TiO_2$) or yttrium oxide ($Y_2O_3$).

Thereby, the high temperature uniformity of the wafer and the high rigidity of the porous part 70 can be obtained.

For example, the porous part 70 includes one of aluminum oxide, titanium oxide and yttrium oxide as a main component.

In the specification, a ceramic purity such as aluminum oxide of the ceramic dielectric substrate 11 can be measured by a fluorescent X-ray analysis, ICP-AES method (Inductive Coupled Plasma-Atomic Emission Spectrometry: high-frequency inductively coupled plasma emission spectrometric analysis method) or the like.

For example, a material of the porous region 71 is the same as a material of the dense region 73. However, the material of the porous region 71 may be different from the material of the dense region 73. A composition of the material of the porous region 71 may be different from a composition of the material of the dense region 73.

Figure 3A:
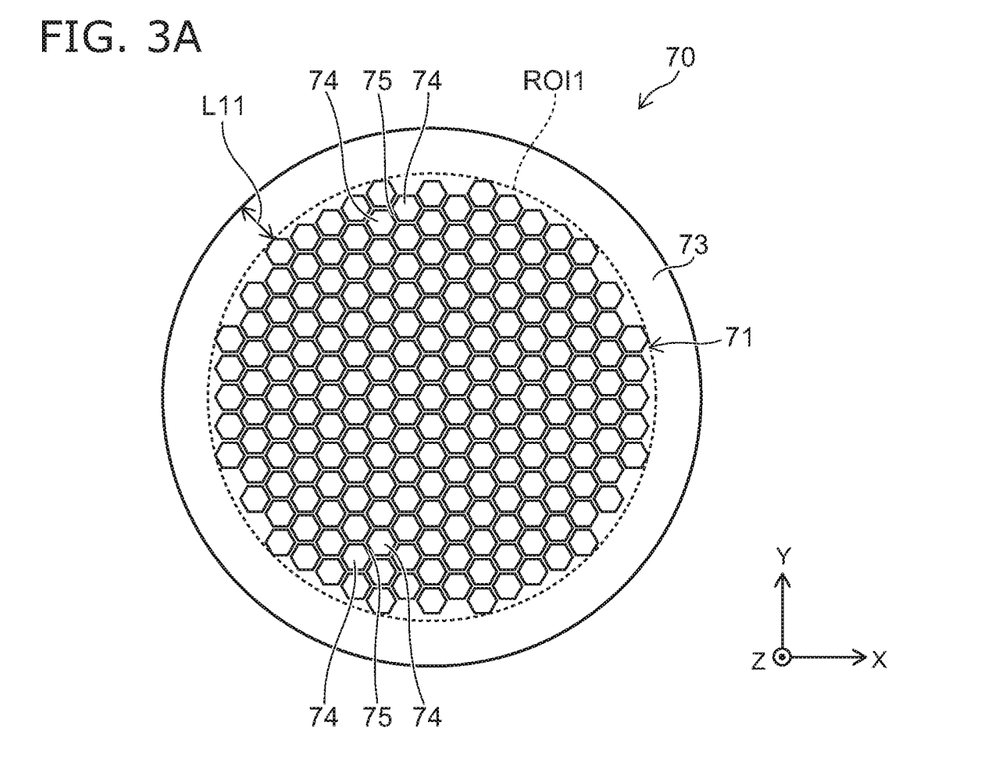
FIG. 3A and FIG. 3B are schematic views illustrating a porous part of the electrostatic chuck according to the embodiment.
Figure 3B:
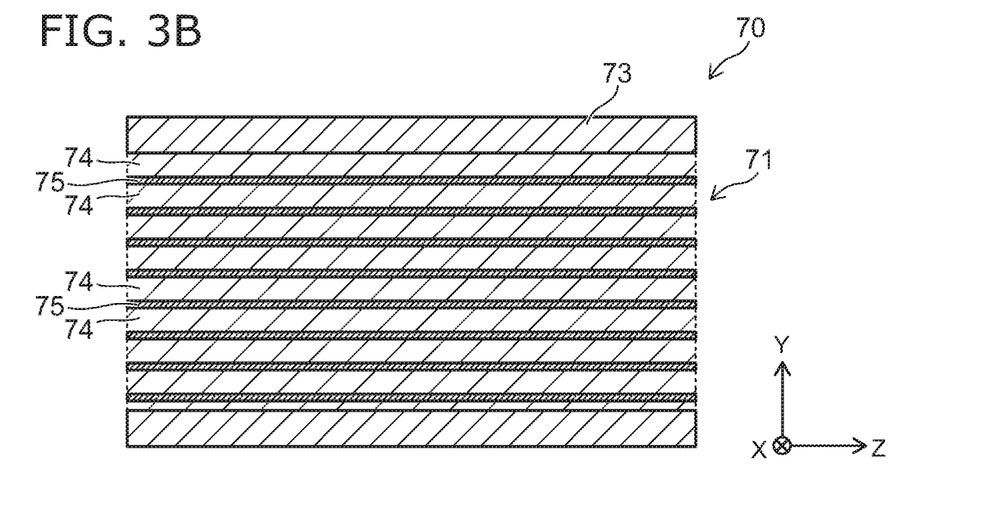

FIG. 3A and FIG. 3B are schematic views illustrating the porous part of the electrostatic chuck according to the embodiment.

FIG. 3A is a plan view of the porous part 70 viewed along the Z-direction, and FIG. 3B is a cross sectional view of the porous part 70 in a ZY plane.

As shown in FIG. 3A and FIG. 3B, in this example, the porous region 71 includes multiple sparse portions 74 and a dense portion 75. Each of the multiple sparse portions 74 includes multiple pores. The dense portion 75 is denser than the sparse portions 74. That is, the dense portion 75 is a portion with a fewer pores than the sparse portions 74, or a portion with substantially no pore. A porosity of the sparse portions 75 is lower than a porosity of the dense portion 74. For that reason, the density of the dense portion 75 is higher than the density of the sparse portions 74. The porosity of the dense portion 75 may be the same as the porosity of the dense region 73. Since the dense portion 75 is dense compared with the sparse portions 74, the rigidity of the dense portion 75 is higher than the rigidity of the sparse portions 74.

The porosity of one sparse portion 74 is, for example, a ratio of the space (pore) included in the sparse portion 74 to the whole volume of the sparse portion 74. The porosity of the dense portion 75 is, for example, a ratio of the volume of the space (pore) included in the dense portion 75 to the whole volume of the dense portion 75. For example, the porosity of the sparse portion 74 is not less than 20% and not more than 60%, favorably not less than 30% and not more than 50%, and the porosity of the dense portion 75 is not less than 0% and not more than 5%.

Each of the multiple sparse portions 74 extends in the Z-direction. For example, each of the multiple sparse portions 74 is columnar (cylindrical or polygonal columnar), and is provided to pierce the porous region 71 in the Z-direction. The dense portion 75 is positioned between the multiple sparse portions 74. The dense portion 75 is wall-shaped and partitions the sparse portions 74 which are mutually adjacent. As shown in FIG. 3A, when viewed along the Z-direction, the dense portion 75 is provided to surround the outer circumference of each of the multiple sparse portions 74. The dense portion 75 is continuous to the dense region 73 in the outer circumference of the porous region 71.

The number of the sparse portions 74 provided in the porous region 71 is, for example, not less than 50 and not more than 1000. As shown in FIG. 3A, when viewed along the Z-direction, the multiple sparse portions 74 have substantially the same size. For example, when viewed along the Z-direction, the multiple sparse portions 74 are dispersed isotopically and uniformly in the porous region 71. For example, distances between the adjacent sparse portions 74 (namely, a thickness of the dense portion 75) are substantially constant.

For example, when viewed along the Z-direction, a distance L11 between the side surface 73s of the dense region 73 and the sparse portion 74 closest to the side surface 73s of the multiple sparse portions 74 is not less than 100 μm and not more than 1000 μm.

In this way, the multiple sparse portions 74 and the dense portion 75 which is denser than the sparse portions 74 are provided in the porous region 71, and thereby, in comparison with the case where multiple pores are dispersed three dimensionally and randomly in the porous region 71, the thermal conductivity of the porous part 70 can be increased, while securing the temperature uniformity of the wafer and the flow rate of the gas flowing through the through hole 15, the rigidity of the porous part 70 can be improved.

For example, if the porosity of the porous region 71 increases, the flow rate of the gas increases, however the temperature uniformity of the wafer and the rigidity are decreased. On the contrary, even if the porosity is large, the temperature uniformity of the wafer and the rigidity can be suppressed from decreasing by providing the dense portion 75.

For example, when viewed along the Z-direction, a minimum circle, an ellipse or a polygon including all of the multiple sparse portions 74 are supposed. It can be conceived that the inside of the circle, ellipse or polygon is the porous region 71 and the outside of the circle, ellipse or polygon is the dense region 73.

As described above, the porous part 70 can include the multiple sparse portions 74 including multiple pores 76 including a first pore and a second pore, and the dense portion 75 having a density higher than a density of the sparse portions 74. Each of the multiple sparse portions 74 extends in the Z-direction. The dense portion 75 is positioned between the multiple sparse portions 74. The sparse portions 74 includes a wall portion 77 provided between the pore 76 (first pore) and the pore 76 (second pore). The minimum value of a dimension of the wall portion 77 can be smaller than the minimum value of a dimension of the dense portion 75 in the X-direction or the Y-direction. In this way, since the sparse portions 74 and the dense portion 75 which extend in the Z-direction are provided in the porous part 70, while securing the temperature uniformity of the wafer and the gas flow rate, the mechanical strength (rigidity) of the porous part 70 can be improved.

A dimension of the multiple pores 76 provided in each of the multiple sparse portions 74 can be smaller than the dimension of the dense portion 75 in the X-direction or the Y-direction. In this way, since the dimension of the multiple pores 76 can be sufficiently small, the temperature uniformity of the wafer can be further improved.

A ratio of vertical/side (aspect ratio) of the multiple pores 76 provided in each of the multiple sparse portions 74 can be not less than 30 and not more than 10000. In this way, the temperature uniformity of the wafer can be further improved. More favorably, a lower limit of the ratio of vertical/side (aspect ratio) of the multiple pores 76 is not less than 100 and an upper limit is not more than 1600.

In the X-direction or the Y-direction, the dimension of the multiple pores 76 provided in each of the multiple sparse portions 74 can be not less than 1 micrometer and not less than 20 micrometers. In this way, since the pores 76 having the dimension of 1 to 20 micrometers and extending in one direction can be arranged, the high temperature uniformity of the wafer can be realized.

Figure 6A:
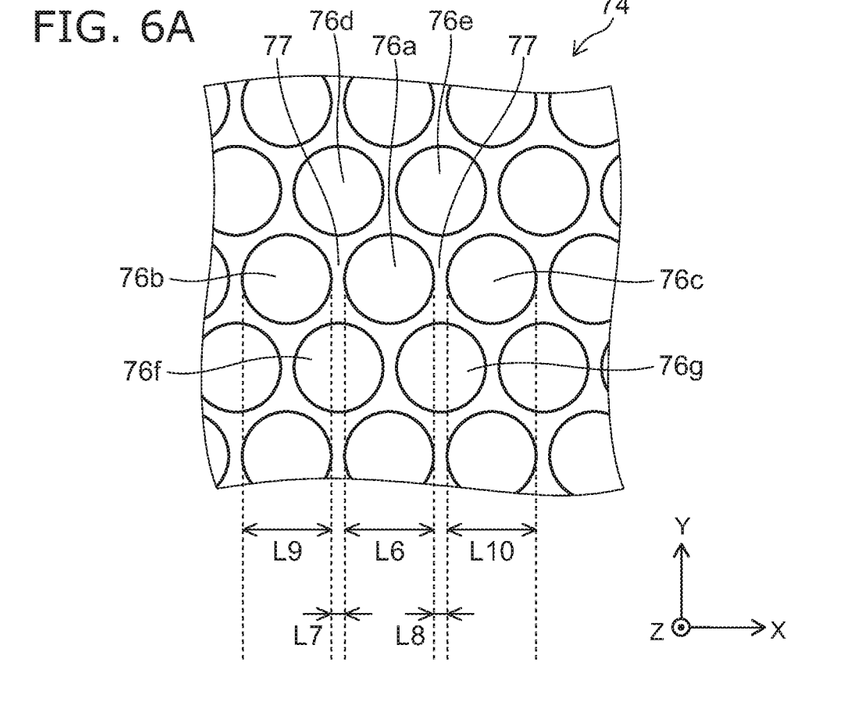
FIG. 6A and FIG. 6B are schematic plan views illustrating the porous part of the electrostatic chuck according to the embodiment.
Figure 6B:
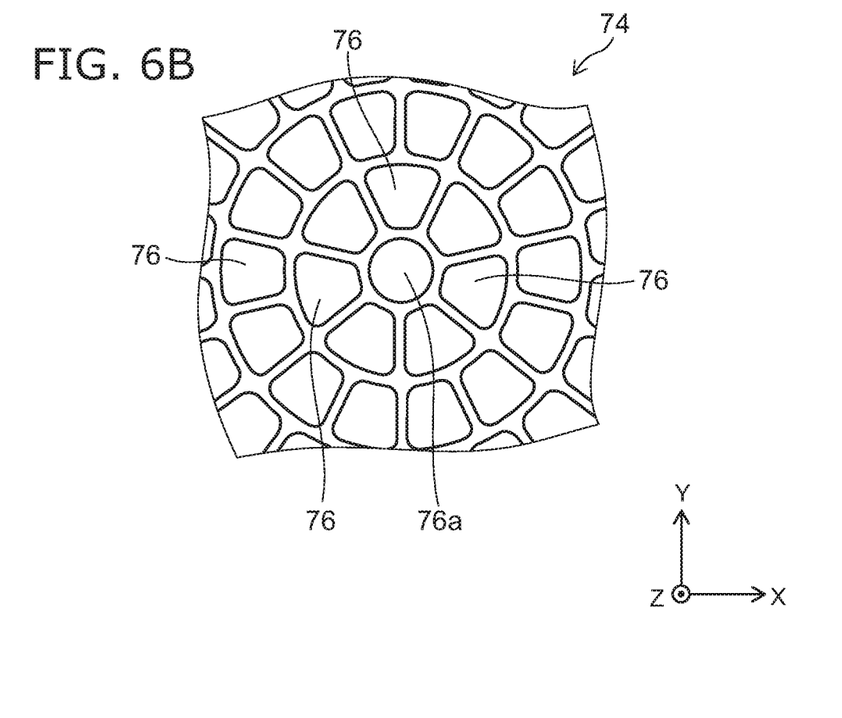

As illustrated in FIG. 6A and FIG. 6B described later, when viewed along the Z-direction, a first pore 76a is positioned at a center portion of the sparse portion 74, and the number of pores 76b to 796g adjacent to the first pore 76a and surrounding the first pore 76a of the multiple holes 76 can be 6. In this way, when viewed along the Z-direction, it is possible to dispose the multiple pores 76 with high isotropy and high density. Thereby, while securing the temperature uniformity of the wafer and the flow rate of the flowing gas, the rigidity of the porous part 70 can be improved.

Figure 4:
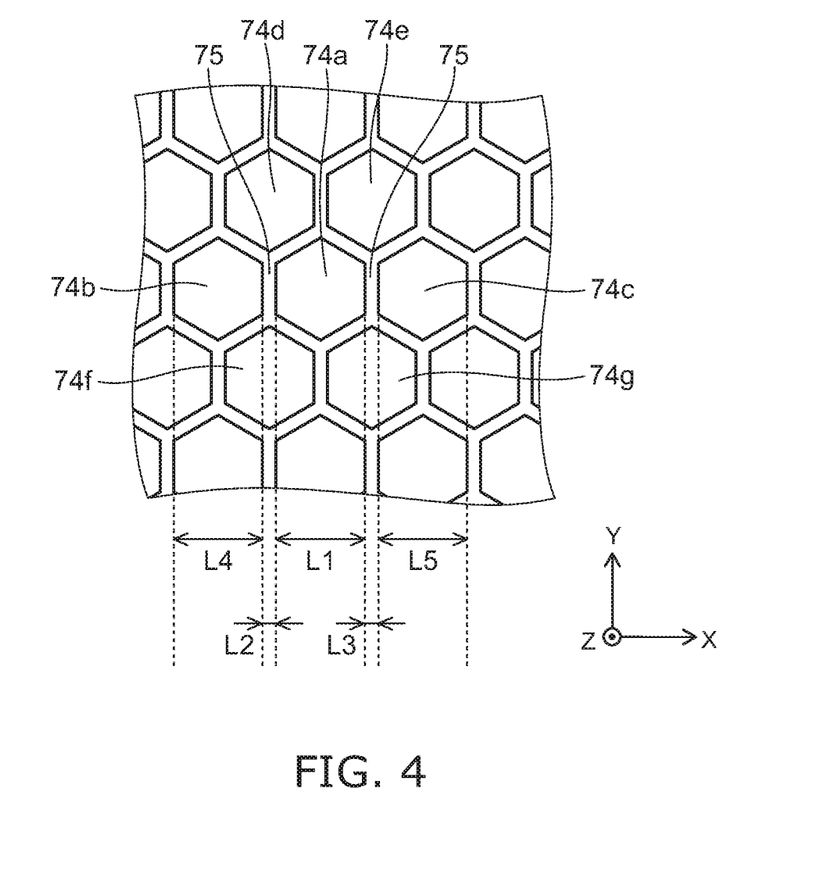
FIG. 4 is a schematic plan view illustrating the porous part of the electrostatic chuck according to the embodiment.

FIG. 4 is a schematic plan view illustrating the porous part of the electrostatic chuck according to the embodiment.

FIG. 4 shows a portion of the porous part 70 as viewed along the Z-direction, and corresponds to an enlarged view of FIG. 3A.

When viewed along the Z-direction, each of the multiple sparse portions 74 is substantially hexagon (substantially regular hexagon). When viewed along the Z-direction, the multiple sparse portions 74 includes a first sparse portion 74a positioned at a center portion of the porous region 71 and six sparse portions 74 (second to seventh sparse portions 74b to 74g) surrounding the first sparse portion 74a.

The second to seventh sparse portions 74b to 74g are adjacent to the first sparse portion 74a. The second to seventh sparse portions 74b to 74g are the sparse portions 74 closest to the first sparse portion 74a of the multiple sparse portions 74.

The second sparse portion 74b and the third sparse portion 74c are arranged with the first sparse portion 74a in the X-direction. That is, the first sparse portion 74a is positioned between the second sparse portion 74b and the third sparse portion 74c.

A length L1 (a diameter of the first sparse portion 74a) along the X-direction of the first sparse portion 74a is longer than a length L2 along the X-direction between the first sparse portion 74a and the second sparse portion 74b, and is longer than a length L3 along the X-direction between the first sparse portion 74a and the third sparse portion 74c.

Each of the length L2 and the length L3 corresponds to the thickness of the dense portion 75. That is, the length L2 is a length along the X-direction of the dense portion 75 between the first sparse portion 74a and the second sparse portion 74b. The length L3 is a length along the X-direction of the dense portion 75 between the first sparse portion 74a and the third sparse portion 74c. The length L2 and the length L3 are substantially the same. For example, the length L2 is not less than 0.5 times and not more than 2.0 times of the length L3.

The length L1 is substantially the same as a length L4 (a diameter of the second sparse portion 74b) along the X-direction of the second sparse portion 74b, and substantially the same as a length L5 (a diameter of the third sparse portion 74c) along the X-direction of the third sparse portion 74c. For example, each of the length L4 and the length L5 is not less than 0.5 times and not more than 2.0 times of the length L1.

In this way, the first sparse portion 74a is adjacent to six parse portions 74 of the multiple sparse portions 74 and is surrounded. That is, when viewed along the Z-direction, the number of the sparse portions 74 adjacent to one sparse portion 74 at the center portion of the porous region 71 is 6. Thereby, in a plan view, it is possible to dispose the multiple sparse portions 74 with high isotropy and high density. Thereby, while securing the high temperature uniformity of the wafer and the flow rate of the gas flowing through the through hole 15, the rigidity of the porous part 70 can be improved. Variation of the flow rate of the gas flowing through the through hole 15, and variation of the rigidity of the porous part 70 can be suppressed.

The diameter of the sparse portions 74 (the length L1, L4, or length L5 or the like) is, for example, not less than 50 µm and not more than 500 µm. The thickness (the length L2 or L3 or the like) of the dense portion 75 is, for example, not less than 10 µm and not more than 100 µm. The diameter of the sparse portions 74 is larger than the thickness of the dense portion 75. The thickness of the dense portion 75 is thinner than the thickness of the dense region 73.

Figure 5:
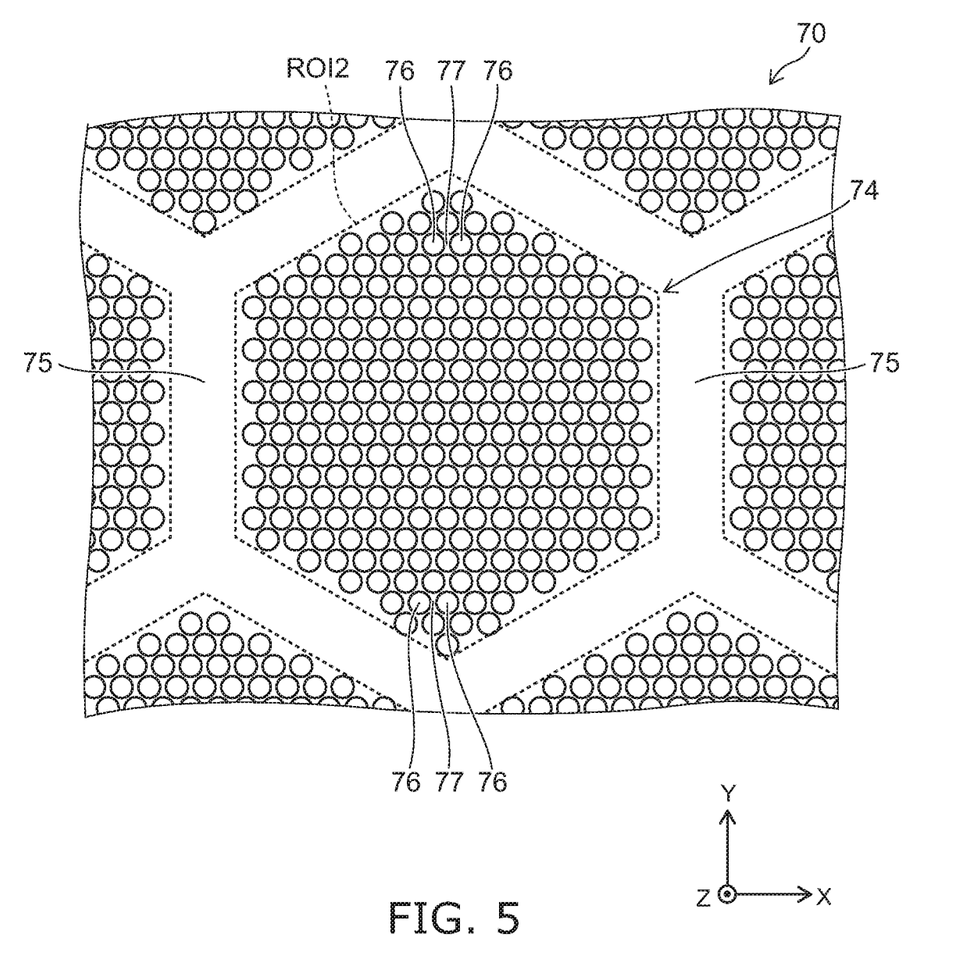
FIG. 5 is a schematic plan view illustrating the porous part of the electrostatic chuck according to the embodiment.

FIG. 5 is a schematic plan view illustrating the porous part of the electrostatic chuck according to the embodiment.

FIG. 5 shows a portion of the porous part 70 as viewed along the z-direction. FIG. 5 is an enlarged view around one sparse portion 74.

As shown in FIG. 5, in this example, the sparse portions 74 include the multiple pores 76 and the wall portion 77 provided between the multiple pores 76.

Each of the multiple pores 76 extends in the Z-direction. Each of the multiple pores 76 has a capillary-shape extending in one direction (one-dimensional capillary structure), and pierces the sparse portions 74 in the Z-direction. The wall portion 77 is wall-shaped and partitions the pores 76 which are mutually adjacent. As shown in FIG. 5, when viewed along the Z-direction, the wall portion 77 is provided to surround the outer circumference of each of the multiple pores 76. The wall portion 77 is continuous to the dense portion 75 in the outer circumference of the sparse portion 74.

The number of the pores 76 provided in one sparse portion 74 is, for example, not less than 50 and not more than 1000. As shown in FIG. 5, when viewed along the Z-direction, the multiple pores 76 have substantially the same size. For example, when viewed along the Z-direction, the multiple pores 76 are dispersed isotopically and uniformly in the sparse portion 74. For example, distances between the adjacent pores 76 (namely, a thickness of the wall portion 77) are substantially constant.

In this way, since the pores 76 extending in one direction are arranged in the sparse portion 74, in comparison with the case where multiple pores are dispersed three dimensionally and randomly in the sparse portions, the high temperature uniformity of the wafer can be realized.

The shape of the sparse portions 74 is not limited to a hexagon, but may be a circle (or ellipse) and other polygon. For example, when viewed along the Z-direction, a minimum circle, an ellipse or a polygon including all of the multiple pores 76 arranged with an interval not more than 10 µm are supposed. It can be conceived that the inside of the circle, ellipse or polygon is the sparse portion 74 and the outside of the circle, ellipse or polygon is the dense portion 75.

FIG. 6A and FIG. 6B are schematic plan views illustrating the porous part of the electrostatic chuck according to the embodiment.

FIG. 6A and FIG. 6B show a portion of the porous part 70 as viewed along the Z-direction, and are enlarged views showing the pores 76 in one sparse portion 74.

As shown in FIG. 6A, when viewed along the Z-direction, the multiple pores 76 include the first pore 76a positioned at the center portion of the sparse portion 74, six pores 76 (the second to seventh pores 76b to 76g) surrounding the first pore 76a. The second to seventh pores 76b to 76g are adjacent to the first pore 76a. The second to seventh pores 76b to 76g are the pores 76 closest to the first pore 76a of the multiple pores 76.

The second pore 76b and the third pore 76c are arranged with the first pore 76a in the X-direction. That is, the first pore 76a is positioned between the second pore 76b and the third pore 76c.

For example, a length L6 (a diameter of the first pore 76a) along the X-direction of the first pore 76a is longer than a length L7 along the X-direction between the first pore 76a and the second pore 76b, and is longer than a length L8 along the X-direction between the first pore 76a and the third pore 76c.

Each of the length L7 and the length L8 corresponds to the thickness of the wall portion 77. That is, the length L7 is a length along the X-direction of the wall portion 77 between the first pore 76a and the second pore 76b. The length L8 is a length along the X-direction of the wall portion 77 between the first pore 76a and the third pore 76c. The length L7 and the length L8 are substantially the same. For example, the length L7 is not less than 0.5 times and not more than 2.0 times of the length L8.

The length L6 is substantially the same as a length L9 (a diameter of the second pore 76b) along the X-direction of the second pore 76b, and substantially the same as a length L10 (a diameter of the third pore 76c) along the X-direction of the third pore 76c. For example, each of the length L9 and the length L10 is not less than 0.5 times and not more than 2.0 times of the length L6.

For example, if the diameter of the pore is small, the temperature uniformity of the wafer and the rigidity are improved. On the other hand, if the diameter of the pore is large, the gas flow rate can be large. The diameter of the pore 76 (the length L6, L9, or L10 or the like) is, for example, not less than 1 micrometer ($\mu$m) and not more than 20 $\mu$m. Since the pores having the diameter of 1 to 20 $\mu$m and extending in one direction are arranged, the high temperature uniformity of the wafer can be realized. The diameter of the pore 76 is more favorably not less than 3 $\mu$m and not more than 10 $\mu$m.

Here, a measurement method of the diameter of the pores 76 will be described. An image is acquired with magnification of not less than 1000 times by using a scanning electron microscopy (for example, Hitachi High Technologies, S-3000). Equivalent circular diameters of 100 pieces for the pores 76 are calculated by using a commercially available image analysis software, and the average value is taken as the diameter of the pores 76.

It is further favorable to suppress the variation of the diameters of the multiple pores 76. It is possible to control more precisely the flow rate of the flowing gas and the temperature uniformity of the wafer by making the variation of the diameters small. A cumulative distribution of 100 pieces equivalent circular diameters acquired in the calculation of the above diameters of the pores 76 can be used as the variation of the diameters of the multiple pores 76. Specifically, the concept of the particle diameter D50 (median diameter) at 50 vol % of the cumulative distribution and the particle diameter D90 at 90 vol % used generally for the particle size distribution measurement is applied, and the cumulative distribution graph of the pores 76 taking the horizontal axis as a pore diameter ($\mu$m) and taking the vertical axis as a relative pore volume (%) is used, and then the pore diameter (corresponding to D50 diameter) at 50 vol % of the cumulative distribution and the pore diameter (corresponding to D90 diameter) at 90 vol % of the cumulative distribution are found. It is favorable that the variation of the diameters of the multiple pores 76 is suppressed to a level satisfying the relationship of $D50:D90 \leq 1:2$.

The thickness of the wall portion 77 (the length L7, L8 or the like) is, for example, not less than 1 $\mu$m and not more than 10 $\mu$m. The thickness of the wall portion 77 is thinner than the thickness of the dense portion 75.

In this way, the first pore 76a is adjacent to six pores 76 of the multiple pores 76 and surrounded. That is, when viewed along the Z-direction, the number of the pores 76 adjacent to one pore 76 at the center portion of the sparse portion 74 is 6. Thereby, in a plan view, it is possible to dispose the multiple pores 76 with high isotropy and high density. Thereby, while securing the high temperature uniformity of the wafer and the flow rate of the gas flowing through the through hole 15, the rigidity of the porous part 70 can be improved. The variation of the flow rate of the gas flowing through the through hole 15, and the variation of the rigidity of the porous part 70 can be suppressed.

FIG. 6B shows another example of disposition of the multiple pores 76 in the sparse portion 74. As shown in FIG. 6B, in this example, the multiple pores 76 are concentrically disposed around the first pore 76a. Thereby, in a plan view, it is possible to dispose the multiple pores with high isotropy and high density.

The porous part 70 with the structure as described above can be manufactured, for example, by using extrusion molding. Each of the lengths L0 to L10 can be measured by the observation using a microscopy such as a scanning electron microscopy.

Evaluation of the porosity in the specification will be described. Here, the evaluation of the porosity of the porous part 70 will be described as an example.

The image such as a plan view in FIG. 3A is acquired, and a ratio R1 of the multiple sparse portions 74 to the porous region 71 is calculated by an image analysis. A scanning electron microscopy (for example, Hitachi High Technologies, S-3000) is used for acquiring the image. A BSE image is acquired at an acceleration voltage of 15 kV and with a magnification of 30 times. For example, an image size is 1280×960 pixels, and an image gradation is 256 gradations.

An image analysis software (for example, Win-ROOF Ver6.5 (Mitsuya Shouji)) is used for calculation of the ratio R1 of the multiple sparse portions 74 to the porous region 71.

The calculation of the ratio R1 based on the Win-ROOF Ver6.5 can be made as follows.

An evaluation area ROI1 (see FIG. 3A) is assumed to be the minimum circle (or ellipse) including all sparse portions 74.

Binarization processing by a single threshold (for example, 0) is performed and an area S1 of the evaluation area ROI1 is calculated.

Binarization processing by two thresholds (for example, 0 and 136) is performed and a total area S2 of the multiple sparse portions 74 in the evaluation area ROI1 is calculated. At this time, fill-in process in the sparse portions 74 and deletion of regions with a small area which is considered to be noise (threshold: not more than 0.002) are performed. The two thresholds are appropriately adjusted by brightness and contrast of the image.

The ratio R1 is calculated as a ratio of the area S2 to the area S1. That is, the ratio R1 (%)=(area S2)/(area S1)×100.

In the embodiment, the ratio R1 of the multiple sparse portions 74 to the porous region 71 is, for example, not less than 40% and not more than 70%, favorably not less than 50% and not more than 70%. The ratio R1 is, for example, about 60%.

The image such as a plan view in FIG. 5 is acquired, and a ratio R2 of the multiple pores 76 to the sparse portion 74 is calculated by the image analysis. The ratio R2 corresponds to, for example, the porosity of the sparse portion 74. A scanning electron microscopy (for example, Hitachi High Technologies, S-3000) is used for acquiring the image. A BSE image is acquired at an acceleration voltage of 15 kV and with a magnification of 600 times. For example, an image size is 1280×960 pixels, and an image gradation is 256 gradations.

The image analysis software (for example, Win-ROOF Ver6.5 (Mitsuya Shouji)) is used for calculation of the ratio R2 of the multiple pores 76 to the sparse portion 74.

The calculation of the ratio R2 based on the Win-ROOF Ver6.5 can be made as follows.

An evaluation area ROI2 (see FIG. 5) is assumed to be a hexagon to approximate the shape of the sparse portion 74. All pores 76 provided in one sparse portion 74 are included in the evaluation area ROI2.

Binarization processing by a single threshold (for example, 0) is performed and an area S3 of the evaluation area ROI2 is calculated.

Binarization processing by two thresholds (for example, 0 and 96) is performed and a total area S4 of the multiple pores 76 in the evaluation area ROI2 is calculated. At this time, fill-in process in the pores 76 and deletion of regions with a small area which is considered to be noise (threshold: not more than 1) are performed. The two thresholds are appropriately adjusted by brightness and contrast of the image.

The ratio R2 is calculated as a ratio of the area S4 to the area S3. That is, the ratio R2 (%)=(area S4)/(area S3)×100.

In the embodiment, the ratio R2 of the multiple pores 76 to the sparse portion 74 (the porosity of the sparse portion 74) is, for example, not less than 20% and not more than 60%, favorably not less than 30% and not more than 50%. The ratio R2 is, for example, about 40%.

The porosity of the porous region 71 corresponds to, for example, a product of the ratio R1 of the multiple sparse portions 74 to the porous region 71 and the ratio R2 of the multiple pores 76 to the sparse portion 74. For example, when the ratio R1 is 60% and the ratio R2 is 40%, the porosity of the porous region 71 can be calculated to be about 24%.

The porous part 70 including the porous region 71 having this porosity is used, and thus while securing the flow rate of the gas flowing through the through hole 15, the temperature uniformity of the wafer can be improved.

The magnification of the electron scanning microscopy is favorable to be appropriately selected in a range, for example, a few ten times to a few thousand times depending on the observation object.

Figure 7A:
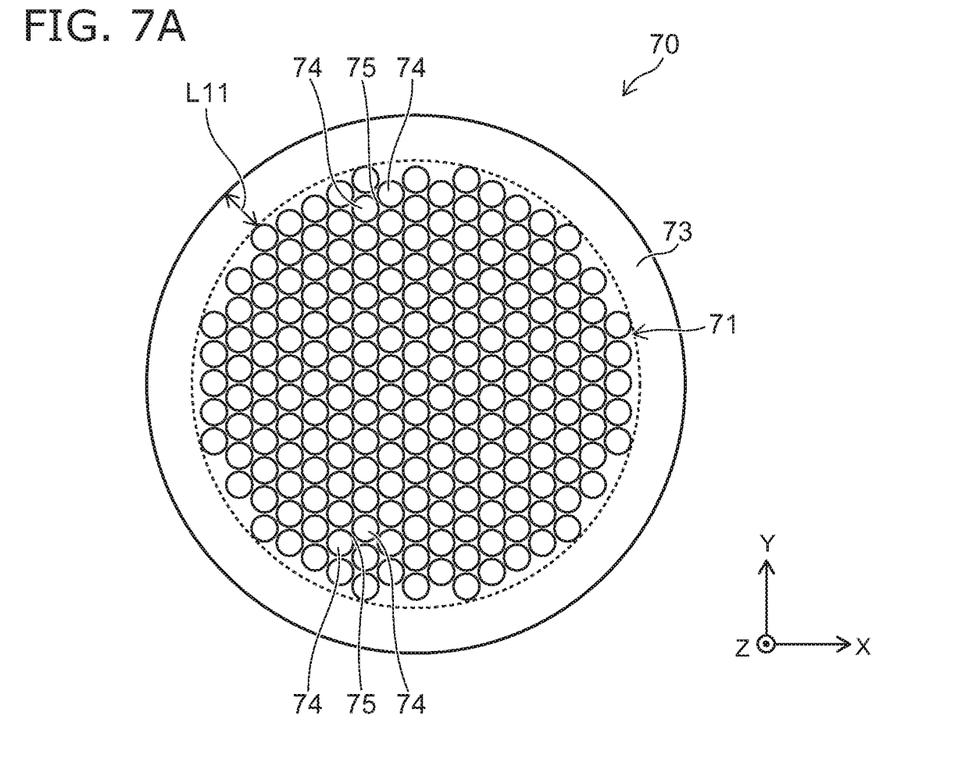
FIG. 7A and FIG. 7B are schematic views illustrating another porous part according to the embodiment.
Figure 7B:
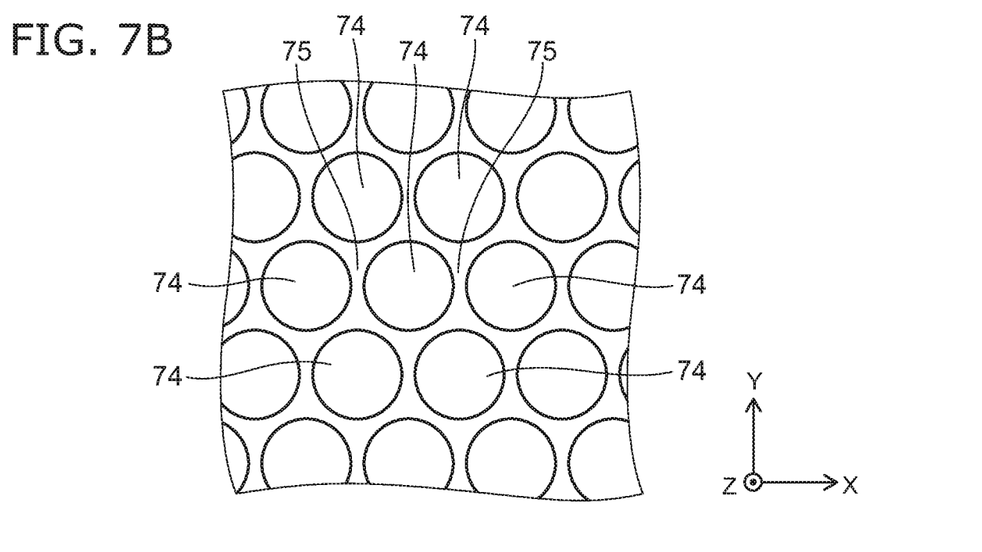

FIG. 7A and FIG. 7B are schematic views illustrating another porous part according to the embodiment.

FIG. 7A is a plan view of the porous part 70 as viewed along the Z-direction, and FIG. 7B corresponds to an enlarged view of a portion of FIG. 7A.

As shown in FIG. 7A and FIG. 7B, in this example, a planar shape of the sparse portions 74 is circular. In this way, the planar shape of the sparse portions 74 may not be hexagonal.

Figure 8:
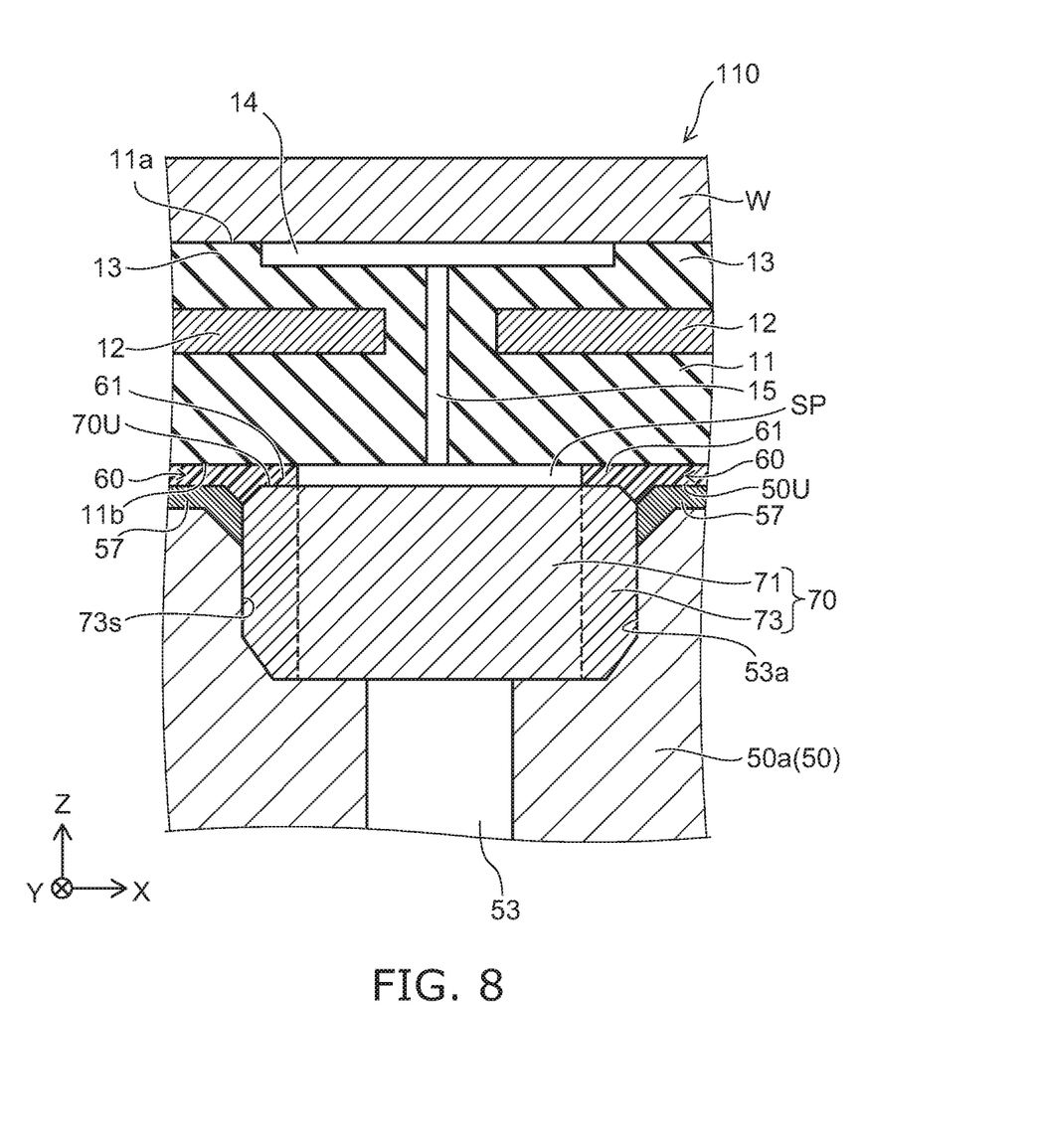
FIG. 8 is a schematic enlarged cross sectional view illustrating a modification of the portion A shown in FIG. 1.

FIG. 8 is a schematic enlarged cross sectional view illustrating a modification of the portion A shown in FIG. 1.

As illustrated in FIG. 8, the bonding layer 60 is provided in a part between the base plate 50 and the ceramic dielectric substrate 11. In this example, the bonding layer 60 includes a first portion 61. The first portion 61 is positioned between the end surface (upper surface 70U) of the porous part 70 on the second major surface 11b side and the second major surface 11b of the ceramic dielectric substrate 11 in the Z-direction. The first portion 61 extends, for example, in the X-direction.

In this way, since the first portion 61 is positioned between the end surface (upper surface 70U) of the porous part 70 on the second major surface 11b side and the second major surface 11b of the ceramic dielectric substrate 11 in the Z-direction, even if a pressure is applied in the Z-direction to the porous part 70 by the gas introduced into the gas introduction path 53, the porous part 70 can be suppressed from moving in the Z-direction. Thereby, position shift of the porous part 70 can be suppressed.

In this example, the base plater 50 includes a thermal-sprayed part 57 at the end on the second major surface 11b side. The thermal-sprayed part 57 is formed by thermal spraying, for example. The thermal-sprayed part 57 forms the end surface (upper surface 50U) of the base plate 50 on the second major surface 11b side. The thermal-sprayed part 57 is provided as necessary, and possible to be omitted.

Figure 9:
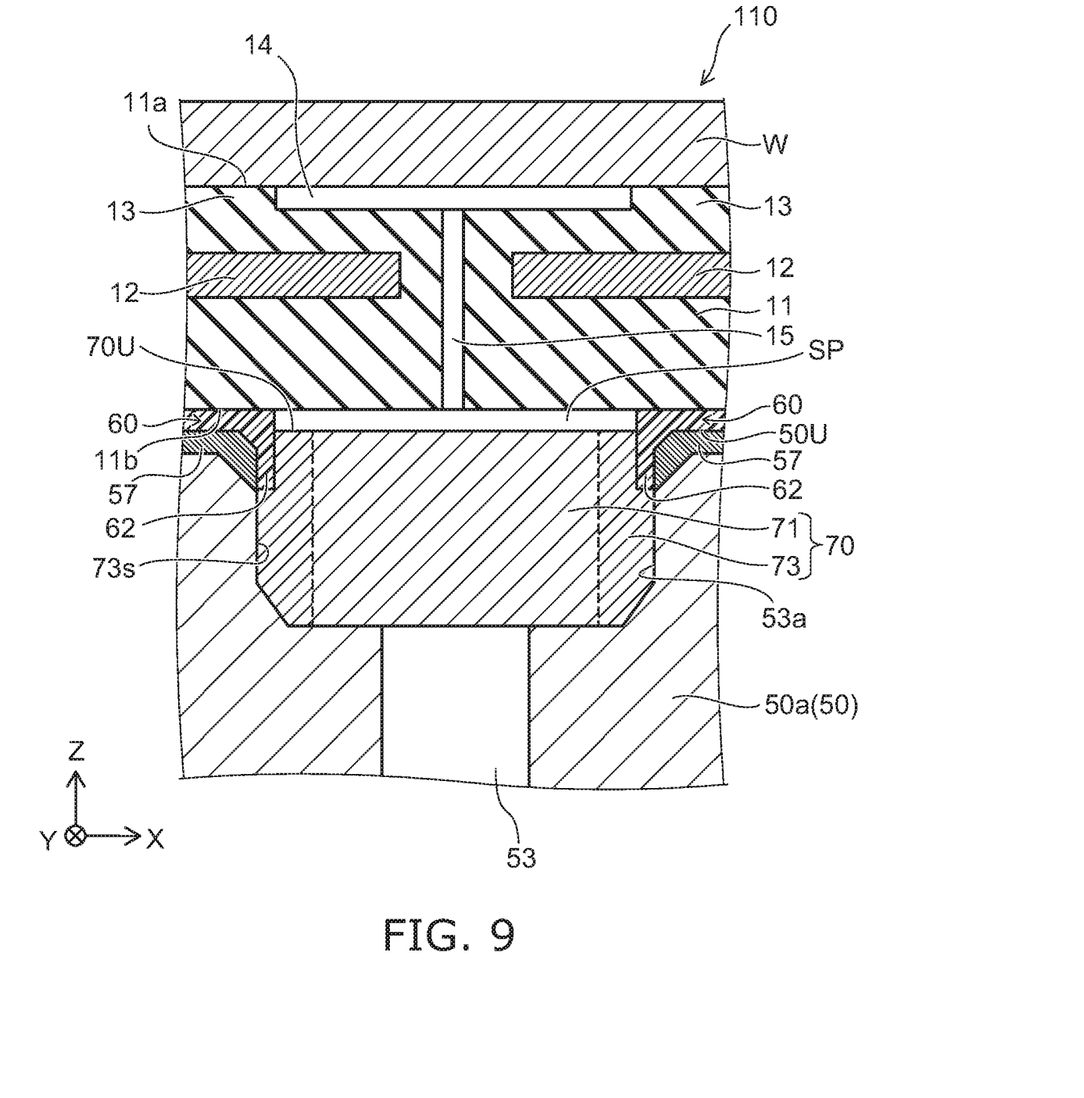
FIG. 9 is a schematic enlarged cross sectional view illustrating a modification of the portion A shown in FIG. 1.

FIG. 9 is a schematic enlarged cross sectional view illustrating a modification of the portion A shown in FIG. 1.

As illustrated in FIG. 9, the bonding layer 60 is provided in a part between the base plate 50 and the ceramic dielectric substrate 11. In this example, the bonding layer 60 includes a second portion 62. The second portion 62 is positioned between the base plate 50 and the porous part 70 in the X-direction. The second portion 62 extends in the Z-direction, for example.

The second portion 62 contacts, for example, the base plate 50 and the porous part 70 in the X-direction. More specifically, one end of the second portion 62 in the X-direction contacts the base plate 50, and the other end of the second portion 62 in the X-direction contacts the porous part 70. The second portion 62 contacts the ceramic dielectric substrate 11 and the porous part 70 in the Z-direction. More specifically, one end (for example, upper end) of the second portion 62 in the Z-direction contacts the ceramic dielectric substrate 11, and the other end (for example, lower end) of the second portion 62 in the Z-direction contacts the porous part 70.

In this way, the bonding layer 60 includes the second portion 62 positioned between the base plate 50 and the porous part 70 in the X-direction, and the second portion 62 contacts the porous part 70 in the Z-direction, and thus the porous part 70 can be surely suppressed from moving in the Z-direction. Thereby, position shift of the porous part 70 can be surely suppressed.

Figure 10:
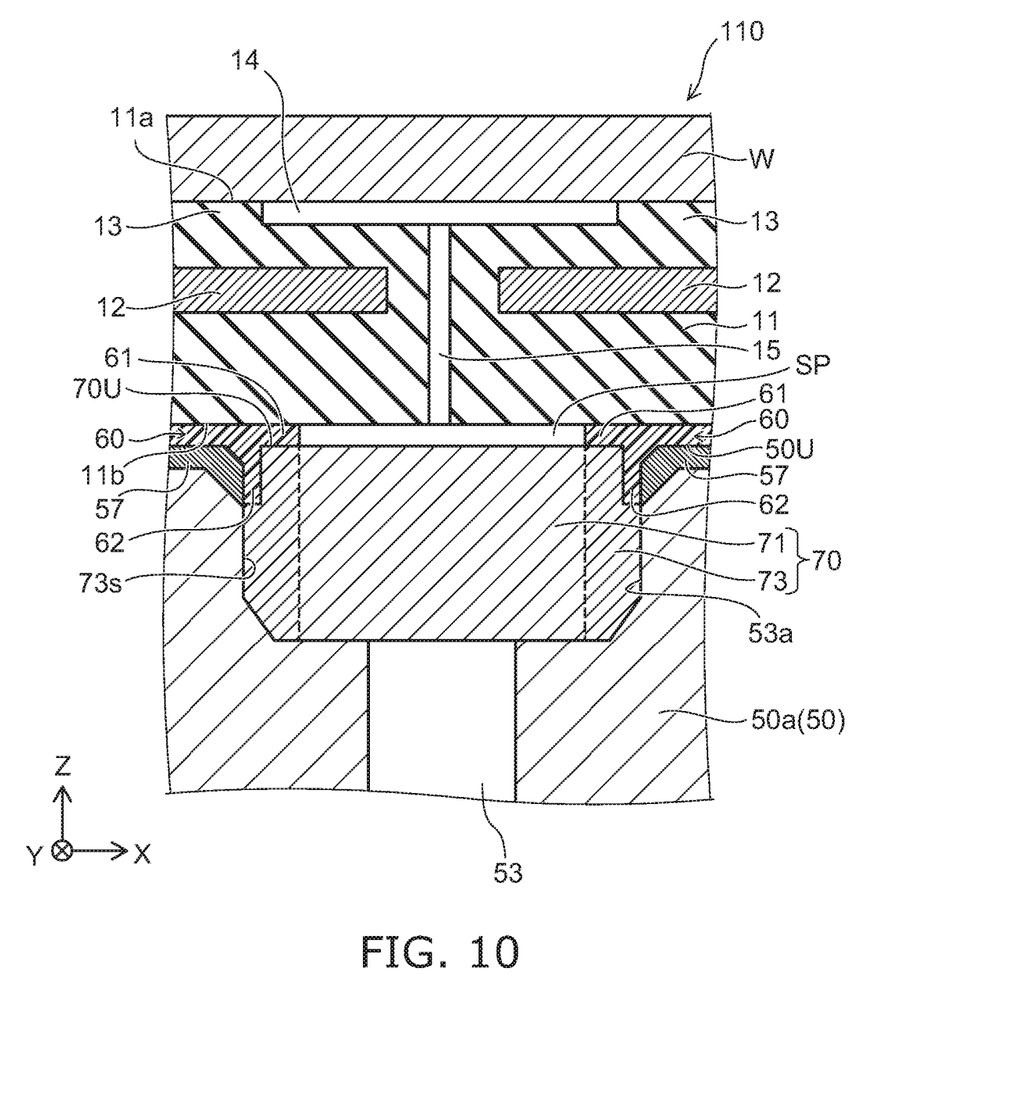
FIG. 10 is a schematic enlarged cross sectional view illustrating a modification of the portion A shown in FIG. 1.

FIG. 10 is a schematic enlarged cross sectional view illustrating a modification of the portion A shown in FIG. 1.

As illustrated in FIG. 10, the bonding layer 60 is provided in a part between the base plater 50 and the ceramic dielectric substrate 11. In this example, the bonding layer 60 includes the first portion 61 and the second portion 62.

In this way, the bonding layer 60 includes the first portion 61 and the second portion 62, and thus the porous part 70 can be surely suppressed from moving in the Z-direction. Thereby, position shift of the porous part 70 can be surely suppressed.

The embodiments of the invention have been described. However the invention is not limited to the descriptions. For example, the configuration of the electrostatic chuck 110 based on Coulomb force has been illustrated, however the configuration based on Johnson-Rahbeck force is also applicable. Any design change of components, or any addition, omission in the above embodiments suitably made by those skilled in the art are also encompassed within the scope of the invention as long as they fall within the spirit of the invention. Further, any components of the embodiments may be combined within the extent of technical feasibility and are included in the scope of the invention to the extent that the feature of the invention is included.

What is claimed is:

1. An electrostatic chuck, comprising:
   a ceramic dielectric substrate having a first major surface configured for placing a suction object, a second major surface on an opposite side to the first major surface, and a through hole provided from the second major surface to the first major surface;
   an electrode disposed in the ceramic dielectric substrate between the first major surface and the second major surface;
   a base plate supporting the ceramic dielectric substrate and including a gas introduction path communicating with the through hole, the base plate being made of a metal; and
   a porous part provided in the gas introduction path,
   the porous part including a plurality of sparse portions including a plurality of pores, and a dense portion having a density higher than a density of the sparse portions,
   each of the plurality of sparse portions extending in a first direction from the base plate toward the ceramic dielectric substrate,
   the dense portion being positioned between the plurality of sparse portions,
   the sparse portions including the pores and a wall portion provided between the pores, and
   a minimum value of a dimension of the wall portion being smaller than a minimum value of a dimension of the dense portion in a second direction substantially perpendicular to the first direction.

2. The electrostatic chuck according to claim 1, wherein a dimension of the plurality of pores provided in each of the plurality of sparse portions is smaller than the dimension of the dense portion in the second direction.

3. The electrostatic chuck according to claim 1, wherein an aspect ratio of the plurality of pores provided in each of the plurality of sparse portions is not less than 30.

4. The electrostatic chuck according to claim 1, wherein a dimension of the plurality of pores provided in each of the plurality of sparse portions is not less than 1 micrometer and not more than 20 micrometers in the second direction.

5. The electrostatic chuck according to claim 1, wherein when viewed along the first direction, the plurality of pores includes a first pore positioned at a center portion of the sparse portions, and
   a number of pores of the plurality of pores adjacent to the first pore and surrounding the first pore is 6.

6. The electrostatic chuck according to claim 1, further comprising:
   a bonding layer provided in a part between the base plate and the ceramic dielectric substrate, the bonding layer including a resin material,
   the bonding layer including a first portion positioned between an end surface of the porous part on the second major surface side and the second major surface in the first direction.

7. The electrostatic chuck according to claim 1, further comprising:
   a bonding layer provided in a part between the base plate and the ceramic dielectric substrate, the bonding layer including a resin material,
   the bonding layer including a second portion positioned between the base plate and the porous part in the second direction, and
   the second portion contacting the porous part in the first direction.

* * * * *